(12) United States Patent
Hayashi

(10) Patent No.: US 6,552,811 B2
(45) Date of Patent: Apr. 22, 2003

(54) CUTTING BLADE DETECTION MECHANISM FOR A CUTTING MACHINE

(75) Inventor: Hiromi Hayashi, Tokyo (JP)

(73) Assignee: Disco Corporation, Tokyo (JP)

( * ) Notice: Subject to any disclaimer, the term of this patent is extended or adjusted under 35 U.S.C. 154(b) by 67 days.

(21) Appl. No.: 09/817,249

(22) Filed: Mar. 27, 2001

(65) Prior Publication Data

US 2001/0035535 A1 Nov. 1, 2001

(30) Foreign Application Priority Data

Apr. 12, 2000 (JP) ........................ 2000-111266

(51) Int. Cl.[7] ........................... G01B 11/14; A47L 15/00
(52) U.S. Cl. ........................................ 356/614; 15/302
(58) Field of Search ................................ 356/244, 246, 356/440, 614, 622, 623; 15/301, 302

(56) References Cited

U.S. PATENT DOCUMENTS

| | | | | |
|---|---|---|---|---|
| 4,558,686 A | * | 12/1985 | Ono ........................ | 125/13.01 |
| 4,794,736 A | * | 1/1989 | Fuwa et al. ............... | 125/13.01 |
| 5,329,961 A | * | 7/1994 | Bouvyn et al. ........... | 139/370.2 |
| 5,433,649 A | * | 7/1995 | Nishida ..................... | 451/5 |
| 6,170,536 B1 | * | 1/2001 | Verhulst et al. .......... | 139/370.2 |

* cited by examiner

*Primary Examiner*—Ricky Mack
(74) *Attorney, Agent, or Firm*—Smith, Gambrell & Russell, LLP

(57) ABSTRACT

A cutting blade detection mechanism for a cutting machine, having a blade passing gap into which a cutting blade for cutting a workpiece passes, and a light emitting means and a light receiving means both of which face the blade passing gap, wherein the cutting blade mechanism comprises cleaning water supply nozzles for supplying cleaning water to the end surfaces of the light emitting means and the light receiving means and air supply nozzles for supplying air to the end surfaces of the light emitting means and the light receiving means.

3 Claims, 6 Drawing Sheets

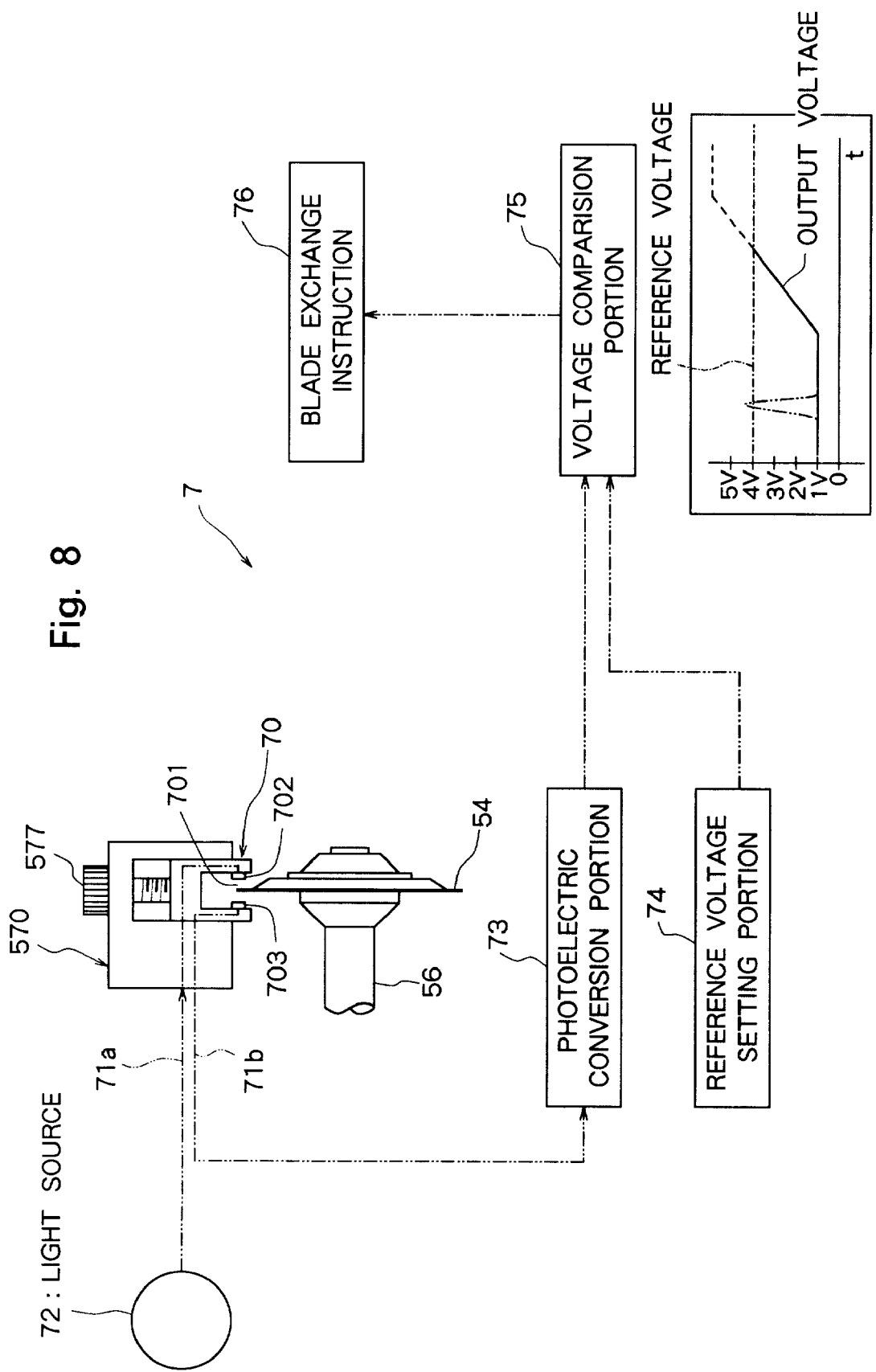

CUTTING BLADE DETECTION MECHANISM FOR A CUTTING MACHINE

FIELD OF THE INVENTION

The present invention relates to a detection mechanism for detecting the standard position of the cutting direction of a cutting blade mounted to a cutting machine such as a dicing machine, or the time of exchanging the cutting blade and a chipped cutting blade.

DESCRIPTION OF THE PRIOR ART

A semiconductor wafer or the like is generally cut by a precision cutting machine called "dicing machine". The dicing machine cuts a workpiece of a semiconductor wafer or the like with a rotating cutting blade. This cutting blade is worn down by its use and its diameter decreases. In the dicing machine, therefore, the standard position of the cutting direction of the cutting blade needs to be adjusted to cope with a reduction in the diameter of the cutting blade and hence, it has a cutting blade detection mechanism for detecting the standard position. The dicing machine also has a cutting blade detection mechanism for detecting the time of exchanging the cutting blade whose diameter is reduced by abrasion and a chipped cutting blade.

The above cutting blade detection mechanism comprises a blade passing gap into which the cutting blade passes, and a light emitting means and a light receiving means both of which face the blade passing gap. In this cutting blade detection mechanism, a light emitted by the light emitting means is received by the light receiving means and the state of the cutting blade located in the blade passing gap between the light emitting means and the light receiving means is detected by converting the amount of light received by the light receiving means into a voltage corresponding to the amount of light. The cutting blade detection mechanism for detecting the standard position of the cutting direction of the cutting blade is disposed on a workpiece holding means for holding a workpiece, and when the cutting blade is moved in a cutting direction so as to gradually pass into the blade passing gap and the voltage corresponding to the amount of light received by the light receiving means reaches a predetermined value, the standard position of the cutting direction of the cutting blade is determined. That is, when the cutting blade is caused to gradually pass into the blade passing gap, the amount of light received by the light receiving means gradually decreases and the value of voltage falls. When the value of voltage reaches a predetermined value, the standard position of the cutting direction of the cutting blade is determined as a position where the cutting blade comes in contact with the top surface of the workpiece holding means, for instance. Meanwhile, the cutting blade detection mechanism for detecting the time of exchanging the cutting blade and a chipped cutting blade is disposed on a spindle unit having the cutting blade. As the cutting blade is worn down, the amount of light intercepted by the cutting blade located between the light emitting means and the light receiving means decreases. In this case, the value of detection voltage gradually rises from the time when the cutting blade has been exchanged and it reaches a predetermined value, the cutting blade detection mechanism indicates the time of exchanging the cutting blade. Further, the above cutting blade detection mechanism judges occurrence of a chipped cutting blade and indicates the time of exchanging the cutting blade since it shows the voltage value exceeding a predetermined value intermittently when the cutting blade is chipped.

There occurs, however, a case where the above cutting blade detection mechanisms can not detect the state of the cutting blade located in the blade passing gap between the light emitting means and the light receiving means because contamination scattered at the time when the workpiece is cut with the cutting blade is adhered to the surfaces of the light emitting means and the light receiving means. That is, when the chippings are adhered to the surface of the light emitting means, the amount of light emitted toward the light receiving means decreases and when the chippings are adhered to the surface of the light receiving means, the amount of light received decreases. Therefore, the state of the cutting blade located in the blade passing gap between the light emitting means and the light receiving means, that is, the standard position of the cutting direction of the cutting blade or the time of exchanging the cutting blade and a chipped cutting blade cannot be detected accurately.

SUMMARY OF THE INVENTION

It is an object of the present invention to provide a cutting blade detection mechanism for a cutting machine that can detect the state of a cutting blade always with stability and high accuracy.

To attain the above object, according to the present invention, there is provided a cutting blade detection mechanism for a cutting machine, which has a blade passing gap into which a cutting blade for cutting a workpiece held by a workpiece holding means for holding the workpiece passes and a light emitting means and a light receiving means both of which face the blade passing gap, wherein the mechanism comprises cleaning water supply nozzles for supplying cleaning water to the end surfaces of the light emitting means and the light receiving means and air supply nozzles for supplying air to the end surfaces of the light emitting means and the light receiving means, respectively.

It is desired that the openings of the air supply nozzles should be arranged adjacent to the light emitting means and the light receiving means and that the openings of the cleaning water supply nozzles should be arranged behind the openings of the air supply nozzles, respectively.

BRIEF DESCRIPTION OF THE DRAWINGS

FIG. 8 is a block diagram of a cutting blade detection mechanism for detecting the time of exchanging a cutting blade and a chipped cutting blade constituted according to the present invention.

DETAILED DESCRIPTION OF THE PREFERRED EMBODIMENTS

A cutting blade detection mechanism for a cutting machine according to preferred embodiments of the present invention will be described in detail with reference to the accompanying drawings hereinafter.

Figure 1:
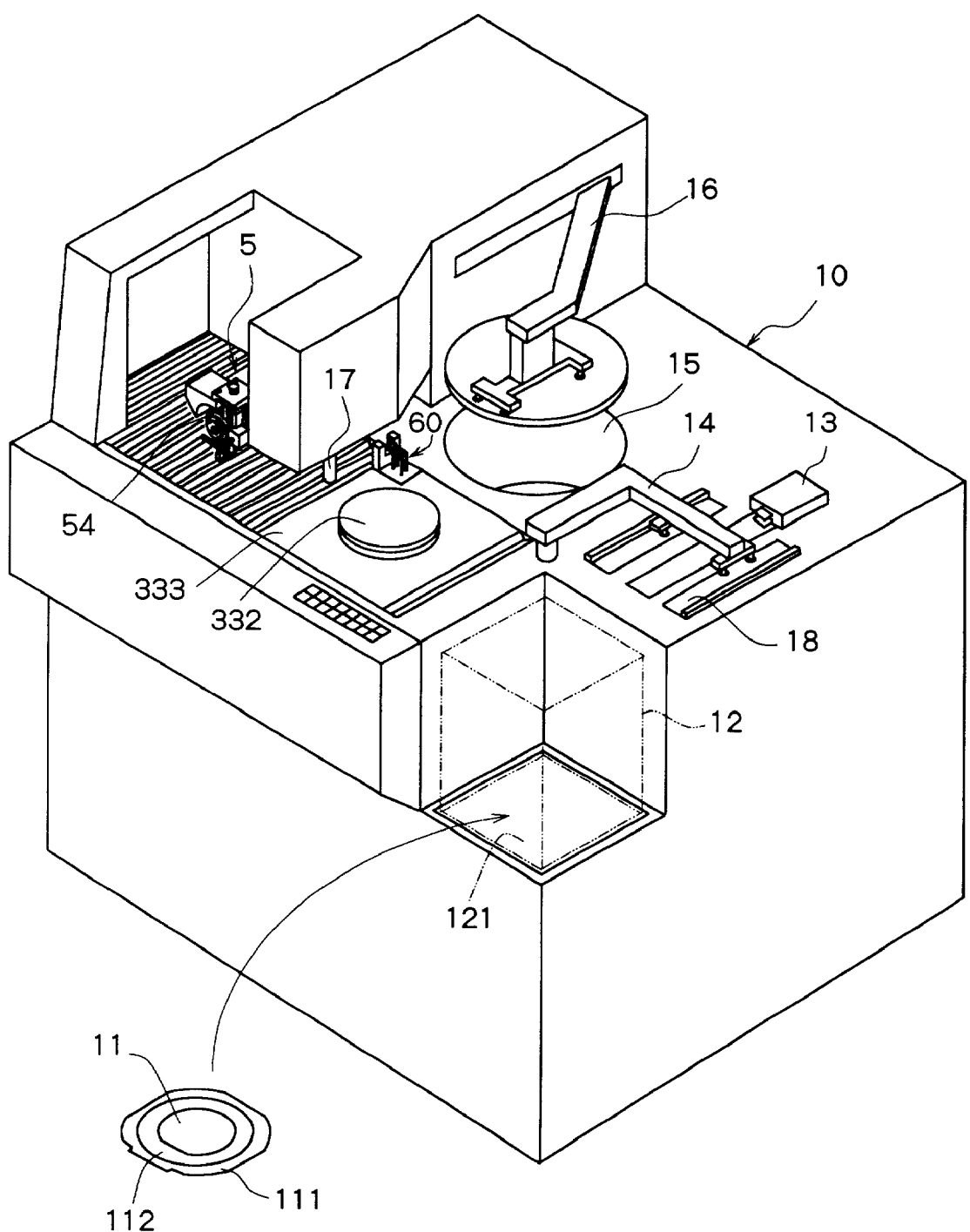
FIG. 1 is a perspective view of a dicing machine which is a cutting machine having a cutting blade detection mechanism constituted according to the present invention.

FIG. 1 is a perspective view of a dicing machine equipped with the cutting blade detection mechanism of the present invention.

Figure 2:
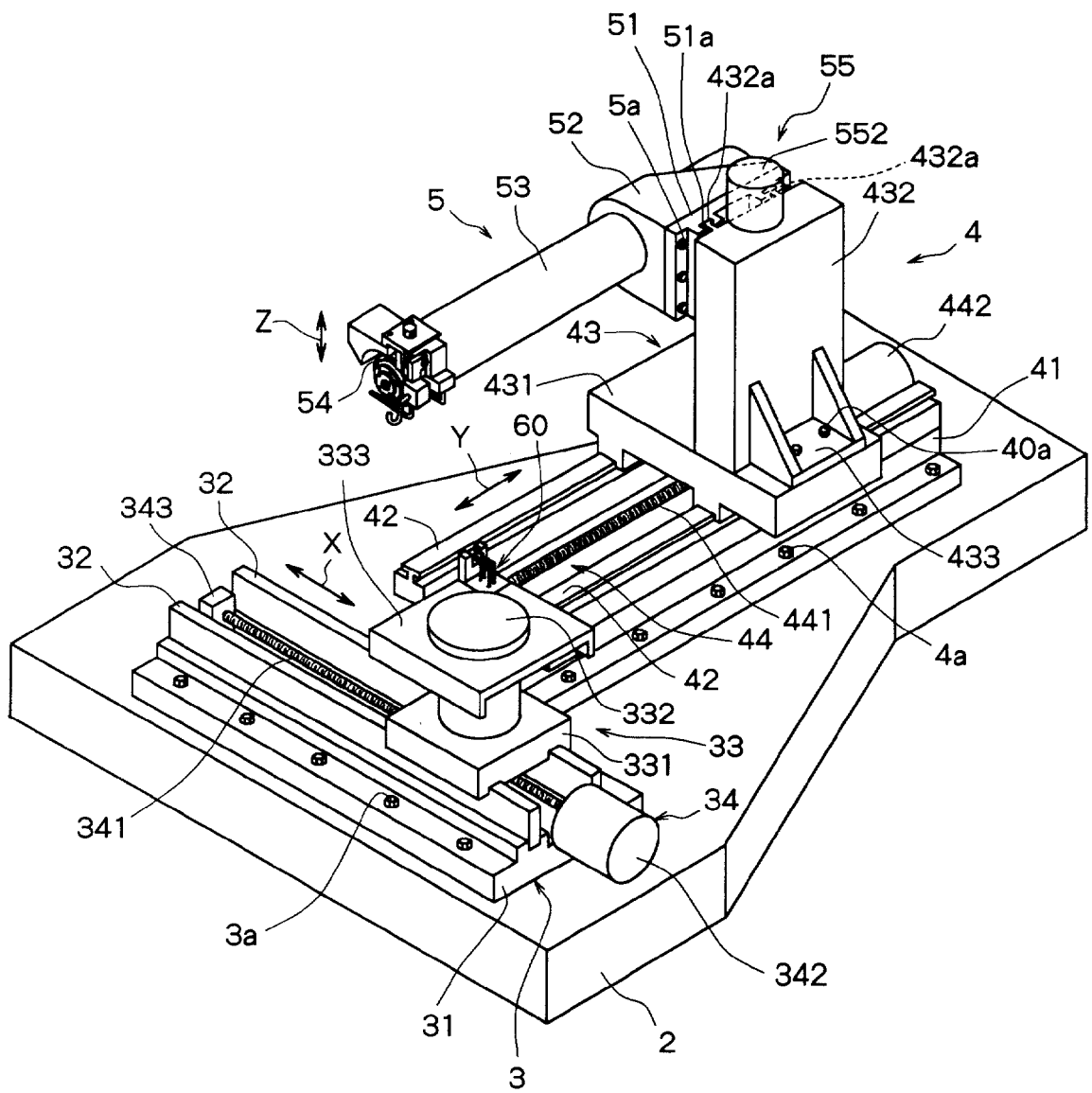
FIG. 2 is a perspective view of a main portion of the dicing machine shown in FIG. 1.

The dicing machine shown in FIG. 1 has a substantially rectangular parallelepiped housing 10. As shown in FIG. 2, the housing 10 comprises a stationary base plate 2, a chuck table mechanism 3 disposed on the stationary base plate 2 movably in a direction indicated by an arrow X that is a feeding direction and holds a workpiece, a spindle support mechanism 4 disposed on the stationary base plate 2 movably in a direction indicated by an arrow Y that is an indexing direction (direction perpendicular to the direction indicated by the arrow X as the feeding direction), and a spindle unit 5 disposed on the spindle support mechanism 4 movably in a direction indicated by an arrow Z that is a cutting direction.

The above chuck table mechanism 3 comprises a support plate 31 disposed on the stationary base plate 2 and secured thereto by a plurality of attachment bolts 3a, two guide rails 32 and 32 arranged on the support plate 31 in parallel to the direction indicated by the arrow X, and a chuck table 33 as a workpiece holding means for holding a workpiece, which is disposed on the guide rails 32 and 32 movably in the direction indicated by the arrow X. This chuck table 33 comprises an adsorption chuck support plate 331 movably disposed on the guide rails 32 and 32, an adsorption chuck 332 mounted on the adsorption chuck support plate 331, and a support table 333 disposed at a predetermined height below the top surface of the adsorption chuck 332. For example, a disk-like semiconductor wafer as the workpiece is held on the adsorption chuck 332 by a suction means that is not shown. The chuck table mechanism 3 has a drive means 34 for moving the chuck table 33 along the two guide rails 32 and 32 in the direction indicated by the arrow X. The drive means 34 comprises a male screw rod 341 disposed between the two guide rails 32 and 32 in parallel thereto, and a drive source such as a pulse motor 342 for rotatively driving the male screw rod 341. The male screw rod 341 is rotatably supported, at its one end, by a bearing block 343 that is fixed on the support plate 31 and is transmission-coupled, at its other end, to the output shaft of the pulse motor 342 through a speed reduction gear that is not shown. The male screw rod 341 is screwed into a female screw through-hole formed in a female screw block (not shown) that projects from the lower surface of the center portion of the adsorption chuck support plate 331 that constitutes the chuck table 33. By driving the male screw rod 341 forward or reverse by the pulse motor 342, therefore, the chuck table 33 can be moved along the guide rails 32 and 32 in the direction indicated by the arrow X. The chuck table mechanism 3 further comprises a rotation mechanism (not shown) for turning the chuck table 33.

The above spindle support mechanism 4 comprises a support plate 41 disposed on the stationary base plate 2 and secured thereto by a plurality of attachment bolts 4a, two guide rails 42 and 42 arranged on the support plate 41 in parallel to the direction indicated by the arrow Y, and a movable support plate 43 disposed on the guide rails 42 and 42 movable in the direction indicated by the arrow Y. This movable support plate 43 comprises a movable support portion 431 movably disposed on the guide rails 42 and 42, and a spindle mounting portion 432 mounted on the movable support portion 431. An attachment bracket 433 is fixed to the spindle-mounting portion 432. By fastening the attachment bracket 433 to the movable support portion 431 with a plurality of attachment bolts 40a, the spindle-mounting portion 432 is mounted to the movable support portion 431. The spindle-mounting portion 432 further has two guide rails 432a and 432a extending, in parallel to each other, in a direction indicated by the arrow Z on a side opposite to the side on which the attachment bracket 433 is mounted. The spindle support mechanism 4 has a drive means 44 for moving the movable support plate 43 along the two guide rails 42 and 42 in the direction indicated by the arrow Y. The drive means 44 includes a male screw rod 441 disposed between the two guide rails 42 and 42 in parallel thereto, and a drive source such as a pulse motor 442 for rotatively driving the male screw rod 441. One end of the male screw rod 441 is rotatably supported by a bearing block (not shown) that is secured onto the above support plate 41, while the other end thereof is transmission-coupled to the output shaft of the above pulse motor 442 through a speed reduction gear (not shown). The male screw rod 441 is screwed into a female screw through-hole formed in a female screw block (not shown) which projects from the lower surface of the center portion of the movable support portion 431 that constitutes the movable support plate 43. By driving the male screw rod 441 forward or reverse by the pulse motor 442, therefore, the movable support plate 43 can be moved along the guide rails 42 and 42 in the direction indicated by the arrow Y.

Figure 5:
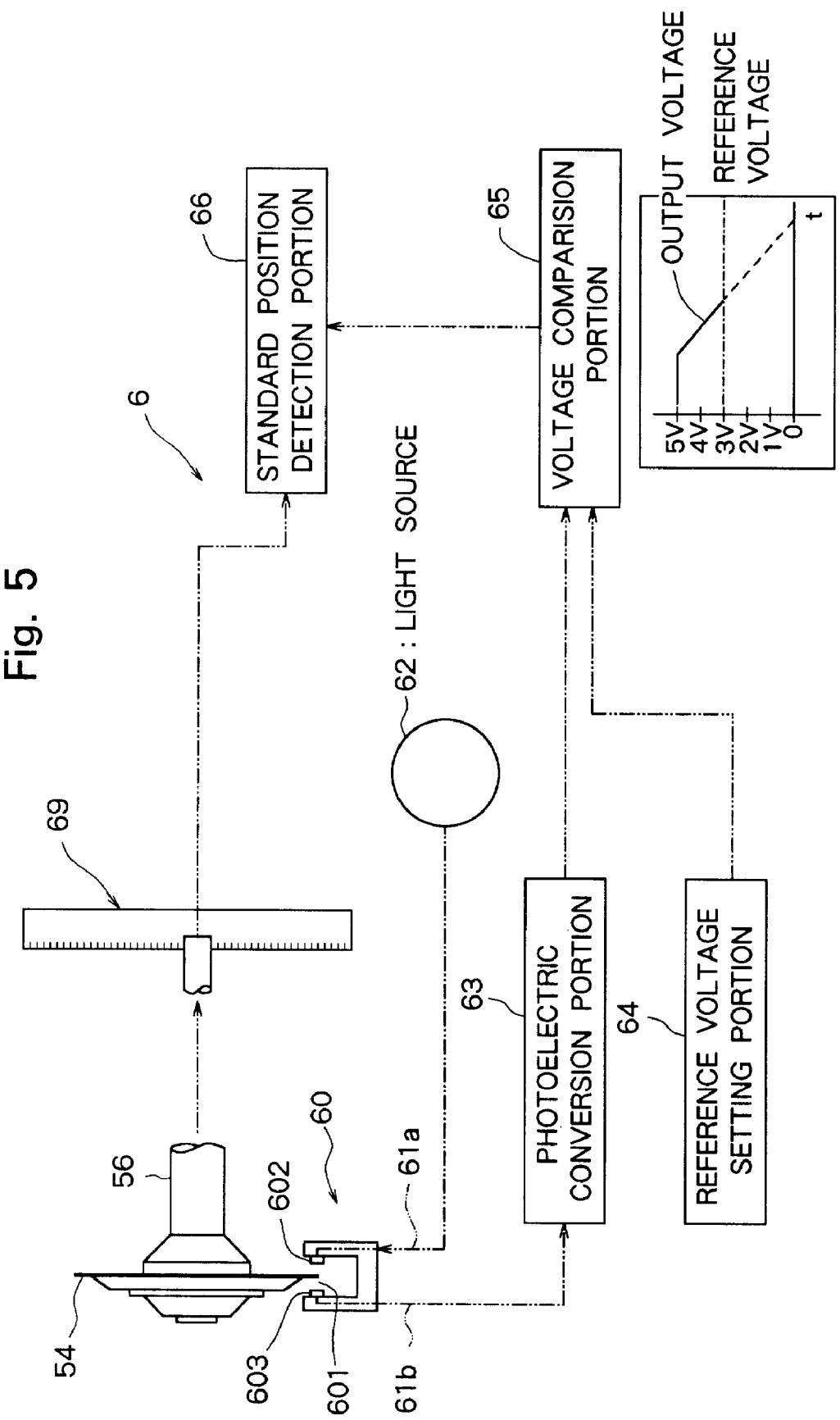
FIG. 5 is a block diagram of a cutting blade detection mechanism for detecting the standard position of the cutting direction of a cutting blade constituted according to the present invention.

The spindle unit 5 comprises a movable base plate 51, a spindle holder 52 fixed to the movable base plate 51 by a plurality of attachment bolts 5a, and a spindle housing 53 mounted on the spindle holder 52. The movable base plate 51 has two to-be-guided rails 51a and 51a that are slidably engaged with the two guide rails 432a and 432a provided on the spindle-mounting portion 432 of the above spindle support mechanism 4, and the movable base plate 51 is movably supported in the direction indicated by the arrow Z by engaging the to-be-guided rails 51a and 51a with the guide rails 432a and 432a. A rotary spindle 56 (see FIG. 3, FIG. 5 and FIG. 8) mounting the afore-described cutting blade 54 is rotatably disposed within the spindle housing 53. This rotary spindle 56 is rotatively driven by a rotary drive mechanism that is not shown. The spindle unit 5 has a drive means 55 for moving the movable base plate 51 along the two guide rails 432a and 432a in the direction indicated by the arrow Z. Like the above drive means 34 and 44, the drive means 55 includes a male screw rod (not shown) disposed between the guide rails 432a and 432a, and a drive source such as a pulse motor 552 for rotatively driving the male screw rod. By driving the male screw rod forward or reverse by the pulse motor 552, the spindle unit 5 can be moved along the guide rails 432a and 432a in the direction indicated by the arrow Z.

Figure 3:
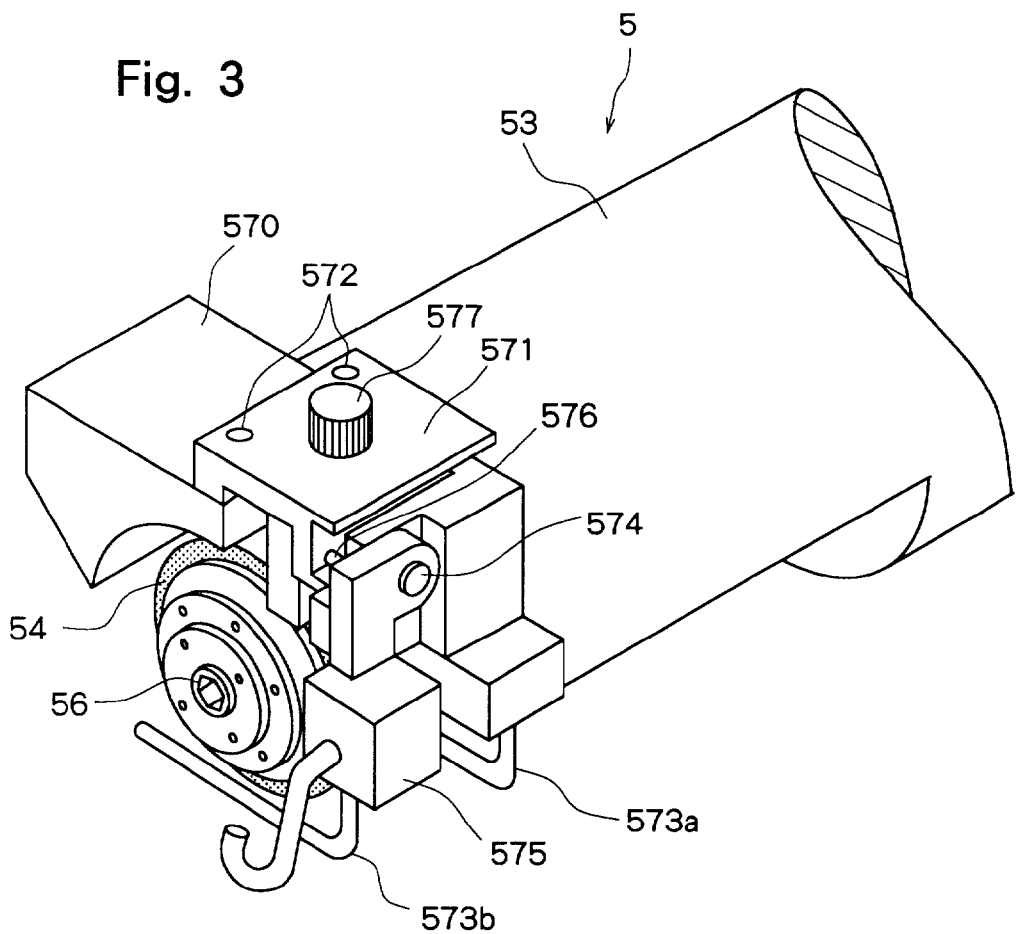
FIG. 3 is an enlarged perspective view of a main portion of a spindle unit constituting the dicing machine shown in FIG. 1.

As shown in FIG. 3, a blade cover 570 for covering the upper half portion of the cutting blade 54 is attached to the front end portion of the spindle housing 53 constituting the above spindle unit 5. A support member 571 for attaching a detection unit body constituting the cutting blade detection mechanism for detecting the time of exchanging the cutting blade and a chipped cutting blade which will be described later is mounted to the blade cover in such a manner that it can slide along guide pins 572 and 572. Cooling water supply nozzles 573a and 573b disposed on both sides of the cutting blade 54 are attached to the blade cover 570. The outer cooling water supply nozzle 573b is attached to a movable attachment member 575 pivotably supported to the blade cover 570 by a pivot 574. These cooling water supply nozzles 578a and 578b are connected to a cooling water supply source by flexible hoses that are not shown. A working pin 576 is attached to the above movable attachment member 575 so that when the movable attachment member 575 is turned upward on the pivot 574, the working pin 576 comes in contact with the lower surface of the above support member 571 to move the support member 571 upward along the guide pins 572 and 572.

Returning to FIG. 1, the illustrated dicing machine comprises a cassette 12 for storing semiconductor wafers 11 which are workpieces, a workpiece delivery means 13, a workpiece conveying means 14, a cleaning means 15, a cleaning/conveying means 16 and an alignment means 17 which is a microscope, a CCD camera or the like. The semiconductor wafer 11 is mounted on a frame 111 using a tape 112, and is stored in the above cassette 12 in a state of being mounted on the frame 111. The cassette 12 is placed on a cassette table 121 which is disposed movably up and down by a lifting means that is not shown.

A brief description is subsequently given of the processing operation of the above-described dicing machine.

The semiconductor wafer 11 in a state mounted on the frame 111 which is stored at a predetermined position of the cassette 12 (the semiconductor wafer 11 of a state mounted on the frame 11 will be simply referred to as "semiconductor wafer 11" hereinafter) is brought to a delivery position by the up and down movement of the cassette table 121 by the lifting means that is not shown. Then, the workpiece delivery means 13 moves back and forth to deliver the semiconductor wafer 11 positioned at the delivery position to a workpiece-placing area 18. The semiconductor wafer 11 delivered to the workpiece-placing area 18 is conveyed onto the adsorption chuck 332 of the chuck table 33 constituting the above chuck table mechanism 3 by the turning movement of the workpiece carrying means 14, and is suction-held by the adsorption chuck 332. The chuck table 33 that has thus suction-held the semiconductor wafer 11 is then moved to a position just below the alignment means 17 along the guide rails 32 and 32. When the chuck table 33 is positioned just below the alignment means 17, a cutting line formed on the semiconductor wafer 11 is detected by the alignment means 17 to allow to carry out a precision alignment operation.

Thereafter, the chuck table 33 suction-holding the semiconductor wafer 11 is moved in the direction indicated by the arrow X which is the feed direction (direction perpendicular to the rotary shaft of the cutting blade 54) to cut the semiconductor wafer 11 held on the chuck table 33 along the predetermined cutting line with the cutting blade 54. That is, as the cutting blade 54 is mounted on the spindle unit 5 which is positioned by being moved and adjusted in the direction indicated by the arrow Y that is the indexing direction and in the direction indicated by the arrow Z that is the cutting direction, and is rotatively driven. By moving the chuck table 33 in the feed direction along the lower side of the cutting blade 54, therefore, the semiconductor wafer 11 held on the chuck table 33 is cut along the predetermined cutting line with the cutting blade 54, and divided into semiconductor chips. The divided semiconductor chips are not separated from one another due to the action of the tape 112 but remain in the state of the semiconductor wafer 11 mounted on the frame 111. After the semiconductor wafer 11 has been cut as described above, the chuck table 33 holding the semiconductor wafer 11 is returned to the position where the semiconductor wafer 11 is first suction-held and discontinues the suction-holding of the semiconductor wafer 11. Thereafter, the semiconductor wafer 11 is conveyed to the cleaning means 15 by the cleaning/conveying means 16 and is cleaned. The thus cleaned semiconductor wafer 11 is delivered to the workpiece-placing area 18 by the workpiece conveying means 14. The semiconductor wafer 11 is then stored at a predetermined position in the cassette 12 by the workpiece delivery means 13.

Figure 4:
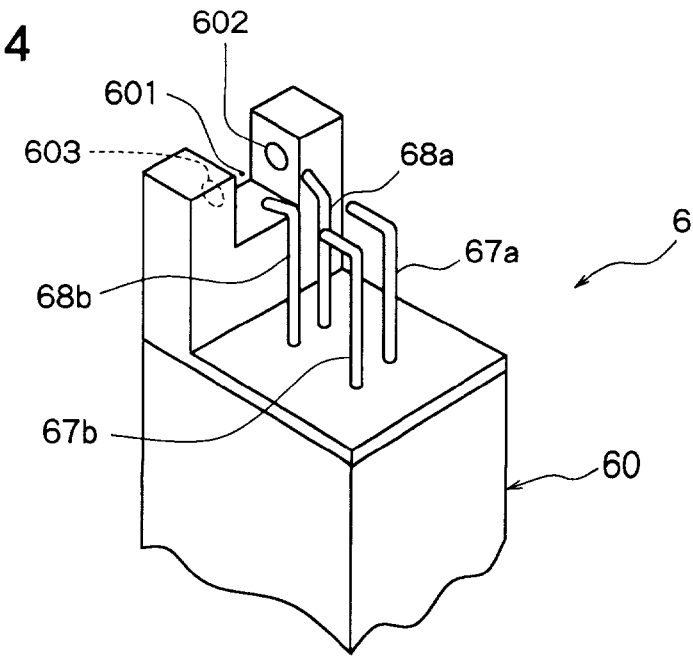
FIG. 4 is a perspective view of a main portion of a cutting blade detection mechanism for detecting the standard position of the cutting direction of a cutting blade constituted according to the present invention.

The illustrated dicing machine has a cutting blade detection mechanism 6 for detecting the standard position of the cutting direction of the above cutting blade 54. The cutting blade detection mechanism 6 will be described with further reference to FIG. 4 and FIG. 5. This cutting blade detection mechanism 6 comprises a detector body 60 having a blade passing gap 601 into which the peripheral portion of the cutting blade 54 passes. This detector body 60 is disposed on a corner portion (see FIG. 1) of the support table 333 constituting the chuck table 33 that is the workpiece holding means. The detector body 60 comprises a light emitting means 602 and a light receiving means 603 both of which face the blade passing gap 601. The light emitting means 602 is connected to a light source 62 by an optical fiber 61a and emits light from the light source 62 toward the light receiving means 603. The light receiving means 603 receives light emitted by the light emitting means 602 and transmits the received light to a photoelectric conversion portion 63 via an optical fiber 61b. The photoelectric conversion portion 63 outputs a voltage corresponding to the amount of light transmitted from the light receiving means 603 to a voltage comparison portion 65. Meanwhile, a reference voltage (for example, 3V) set by a reference voltage setting portion 64 is input into the voltage comparison portion 65. The voltage comparison portion 65 compares the output of the photoelectric conversion portion 63 with the reference voltage (for example, 3 V) set by the reference voltage setting portion 64 and when the output of the photoelectric conversion portion 63 reaches the reference voltage (for example, 3 V), it outputs a signal indicating the above situation to a standard position detection portion 66.

That is, when the standard position of the cutting direction of the cutting blade 54 is to be detected, the cutting blade 54 is caused to enter in the blade passing gap 601 from the upper position. When the cutting blade 54 does not intercept the light between the light emitting means 602 and the light receiving means 603 at all at this moment, the amount of light received by the light receiving means 603 is the largest, and the output from the photoelectric conversion portion 63 corresponding to the amount of light is set to 5 V, for example, in the illustrated embodiment. As the cutting blade 54 passes in the above blade passing gap 601, the amount of light intercepted by the cutting blade 54 between the light emitting means 602 and the light receiving means 603 increases, whereby the output of the photoelectric conversion portion 63 gradually decreases. The output voltage of the photoelectric conversion portion 63 is set to 3 V, for example, when the cutting blade 54 reaches a position corresponding to the lower ends of the light emitting means 602 and the light receiving means 603. When the output voltage of the photoelectric conversion portion 63 becomes, for example, 3 V, the cutting blade 54 is set to locate at a position, for example, where it contacts the top surface of the adsorption chuck 332. Therefore, when the output voltage of the photoelectric conversion portion 63 becomes 3 V, the voltage comparison portion 65 outputs a signal indicating that the output voltage of the photoelectric conversion portion 63 has reached a reference voltage to the standard position detection portion 66. At this point, the standard position detection portion 66 stores a value of a linear scale 69 for detecting the position of the cutting direction (direction Z) of the cutting blade 54 as the standard position. Thus, the cutting blade detection mechanism 6 detects the standard position of the cutting direction of the cutting blade 54.

The cutting blade detection mechanism 6 for detecting the standard position of the cutting direction of the cutting blade 54 in the illustrated embodiment comprises cleaning water supply nozzles 67a and 67b for supplying cleaning water to the end surfaces of the light emitting means 602 and the light receiving means 603 and air supply nozzles 68a and 68b for supplying air to the end surfaces of the light emitting means 602 and the light receiving means 603. In the illustrated embodiment, the cleaning water supply nozzles 67a and 67b and the air supply nozzles 68a and 68b are disposed such that the openings of the air supply nozzles 68a and 68b are arranged adjacent to the light emitting means 602 and the light receiving means 603 and the openings of the cleaning water supply nozzles 67a and 67b are arranged behind the air supply nozzles 68a and 68b, respectively. The cleaning water supply nozzles 67a and 67b are connected to a cleaning water supply source by flexible hoses (not shown) and the air supply nozzles 68a and 68b are connected to a compressed air supply source by flexible hoses (not shown). In the cutting blade detection mechanism 6 of the illustrated embodiment, cleaning water jetted out from the cleaning water supply nozzles 67a and 67b are always supplied to the light emitting means 602 and the light receiving means 603 during cutting work with the cutting blade 54. Meanwhile, air jetted from the air supply nozzles 68a and 68b are supplied to the light emitting means 602 and the light receiving means 603 when the supply of cleaning water from the cleaning water supply nozzles 67a and 67b is stopped after the end of the cutting work.

Since the cutting blade detection mechanism 6 for detecting the standard position of the cutting direction of the cutting blade 54 in the illustrated embodiment is constituted such that cleaning water is always supplied to the end surfaces of the light emitting means 602 and the light receiving means 603 from the cleaning water-supply nozzles 67a and 67b as described above, the light emitting means 602 and the light receiving means 603 are free from adhering of contamination produced at the time when the workpiece of a semiconductor wafer or the like is cut by the cutting blade 54. Therefore, the cutting blade detection mechanism 6 of the illustrated embodiment can prevent a reduction in the amount of emitted light caused by the adhesion of contamination to the light emitting means 602 and a reduction in the amount of received light caused by the adhesion of contamination to the light receiving means 603 at the time when it detects the standard position of the cutting direction of the cutting blade 54, and hence, can detect the standard position of the cutting direction of the cutting blade 54 always with stability and high accuracy. Further, since the cutting blade detection mechanism 6 of the illustrated embodiment blows off cleaning water adhered to the light emitting means 602 and the light receiving means 603 by jetting out air from the air supply nozzles 68a and 68b after cleaning water is supplied to the light emitting means 602 and the light receiving means 603 during cutting work, it can detect the standard position of the cutting direction of the cutting blade 54 always with stability and high precision without being influenced by cleaning water.

Further, since the cutting blade detection mechanism 6 of the illustrated embodiment is constituted such that the openings of the air supply nozzles 68a and 68b are arranged adjacent to the light emitting means 602 and the light receiving means 603 and the openings of the cleaning water supply nozzles 67a and 67b are arranged behind the air supply nozzles 68a and 68b, respectively, the cleaning water remaining in the cleaning water supply nozzles 67a and 67b are not sucked and atomized when air is supplied after the supply of the cleaning water is stopped. That is, when the air supply nozzles 68a and 68b are arranged behind the cleaning water supply nozzles 67a and 67b, respectively, unlike the illustrated embodiment, the openings of the cleaning water supply nozzles 67a and 67b become a negative pressure by the action of air flow jetted out from behind the cleaning water supply nozzles 67a and 67b by the air supply nozzles 68a and 68b. As a result, the cleaning water remaining in the cleaning water supply nozzles 67a and 67b is sucked and atomized and may be adhered to the end surfaces of the light emitting means 602 and the light receiving means 603. To the contrary, as the cutting blade detection mechanism 6 of the illustrated embodiment is constituted such that the openings of the cleaning water supply nozzles 67a and 67b are arranged behind the air supply nozzles 68a and 68b, respectively, as describe above, the cleaning water remaining in the cleaning water supply nozzles 67a and 67b is not sucked and atomized when air is supplied by the air supply nozzles 68a and 68b. Therefore, cleaning water adhered to the light emitting means 602 and the light receiving means 603 can be blown off by air supplied from the air supply nozzles 68a and 68b effectively.

Figure 6:
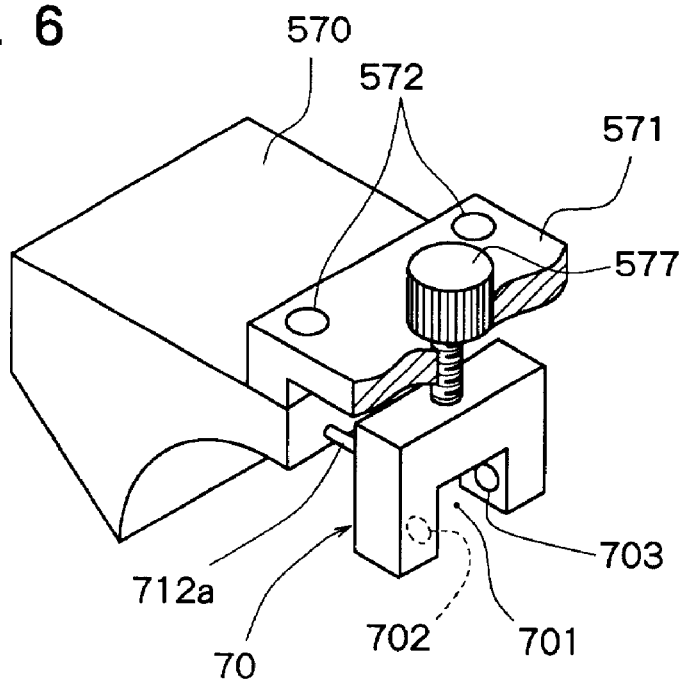
FIG. 6 is a perspective view of a main portion of a cutting blade detection mechanism for detecting the time of exchanging a cutting blade and a chipped cutting blade constituted according to the present invention.
Figure 7:
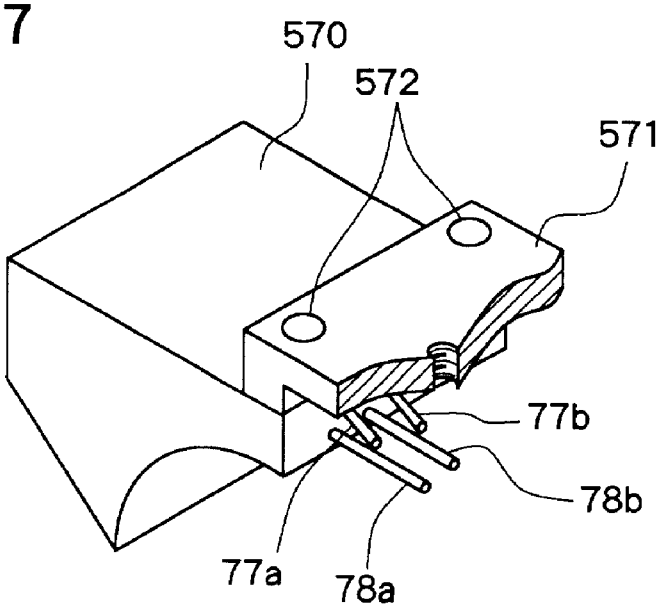
FIG. 7 is a perspective view of a main portion of a cutting blade detection mechanism for detecting the time of exchanging a cutting blade and a chipped cutting blade constituted according to the present invention.

The dicing machine in the illustrated embodiment has a cutting blade detection mechanism 7 for detecting the time of exchanging the cutting blade 54 and a chipped cutting blade. The cutting blade detection mechanism 7 will be described hereinbelow with reference to FIGS. 6 to 8. This cutting blade detection mechanism 7 comprises a detector body 70 disposed on the spindle unit 5. The detector body 70 is attached to the support member 571 mounted on the blade cover 570. That is, the detector body 70 is attached to the end of an adjusting screw 577 screwed into the support member 571. The detector body 70 has a blade passing gap 701 into which the peripheral portion of the cutting blade 54 passes and a light emitting means 702 and a light receiving means 703 both of which face the blade passing gap 701. The light emitting means 702 is connected to a light source 72 by an optical fiber 71a and emits light from the light source 72 toward the light receiving means 703. The light receiving means 703 receives light emitted by the light emitting means 702 and transmits the received light to a photoelectric conversion portion 73 via an optical fiber 71b. The photoelectric conversion portion 73 outputs a voltage corresponding to the amount of light transmitted from the light receiving means 702 to a voltage comparison portion 75. Meanwhile, a reference voltage (for example, 4 V) set by a reference voltage setting portion 74 is input into the voltage comparison portion 75. The voltage comparison portion 75 compares the output of the photoelectric conversion portion 73 with the reference voltage (for example, 4 V) set by the reference voltage setting portion 74 and outputs a signal indicating that the cutting blade 54 reaches the time of exchange or occurrence of a chipped cutting blade to a blade exchange instruction portion 76 when the output of the photoelectric conversion portion 73 reaches the reference voltage (for example, 4 V).

That is, when the time of exchanging the cutting blade 54 or a chipped cutting blade is to be detected, the peripheral portion of the cutting blade 54 is set such that it passes in the blade passing gap 701 in a predetermined amount at the time of exchanging the cutting blade 54. In this state, the cutting blade intercepts the light between the light emitting means 702 and the light receiving means 703 incompletely and at this point, the output from the photoelectric conversion portion 73, which corresponds to the amount of light received by the light receiving means 703, is set to 1 V, for example, in the illustrated embodiment. Since the diameter of the cutting blade 54 decreases as the cutting blade 54 is worn down, the amount of light intercepted by the cutting blade 54 between the light emitting means 702 and the light receiving means 703 reduces, whereby the output of the photoelectric conversion portion 73 gradually increases. When the cutting blade 54 reaches a position corresponding to the lower ends of the light emitting means 702 and the light receiving means 703, the output voltage of the photoelectric conversion portion 73 is set to be 4 V, for example. Therefore, when the output voltage of the photoelectric conversion portion 73 becomes 4 V, the voltage comparison portion 65 outputs a signal indicating that the cutting blade 54 has reached the time of exchange to the blade exchange instructing portion 76. When the cutting blade is chipped, the output voltage of the photoelectric conversion portion 73 exceeds 4 V abruptly, the voltage comparison portion 65 outputs a signal indicating that the cutting blade 54 needs to be exchanged to the blade exchange instructing portion 76.

The cutting blade detection mechanism 7 for detecting the time of exchanging the cutting blade 54 and a chipped cutting blade in the illustrated embodiment comprises cleaning water supply nozzles 77a and 77b for supplying cleaning water to the end surfaces of the light emitting means 702 and the light receiving means 703 and air supply nozzles 78a and 78b for supplying air to the end surfaces of the light emitting means 702 and the light receiving means 703, respectively. The cleaning water supply nozzles 77a and 77b and the air supply nozzles 78a and 78b are disposed in the blade cover 570 and connected to a cleaning water supply source and a compressed air supply source by flexible hoses (not shown), respectively. In the illustrated embodiment, the cleaning water supply nozzles 77a and 77b and the air supply nozzles 78a and 78b are disposed such that the openings of the air supply nozzles 78a and 78b are arranged adjacent to the light emitting means 702 and the light receiving means 703 and the openings of the cleaning water supply nozzles 77a and 77b are arranged behind the air supply nozzles 78a and 78b, respectively. In the cutting blade detection mechanism 7 for detecting the time of exchanging the cutting blade 54 and a chipped cutting blade, cleaning water jetted out from the cleaning water supply nozzles 77a and 77b are always supplied to the light emitting means 702 and the light receiving means 703 during cutting work with the cutting blade 54. Meanwhile, air jetted out from the air supply nozzles 78a and 78b are supplied to the light emitting means 702 and the light receiving means 703 when the supply of cleaning water to the cleaning water supply nozzles 77a and 77b is stopped after the end of the cutting work.

Since the cutting blade detection mechanism 7 for detecting the time of exchanging the cutting blade 54 and a chipped cutting blade in the illustrated embodiment is constituted such that cleaning water is always supplied from the cleaning water supply nozzles 77a and 77b to the end surfaces of the light emitting means 702 and the light receiving means 703 as described above, the light emitting means 702 and the light receiving means 703 are free from adhering of contamination scattered at the time when the workpiece is cut with the cutting blade 54, like the cutting blade detection mechanism 6 for detecting the standard position of the cutting direction of the cutting blade 54. Therefore, when the cutting blade detection mechanism 7 is to detect the time of exchanging the cutting blade 54 and a chipped cutting blade, it can prevent a reduction in the amount of emitted light caused by the adhesion of contamination to the light emitting means 702 and a reduction in the amount of received light caused by the adhesion of contamination to the light receiving means 703 and consequently, it can detect the time of exchanging the cutting blade 54 and a chipped cutting blade always with stability and high accuracy. Since the cutting blade detection mechanism 7 in the illustrated embodiment blows off cleaning water adhered to the light emitting means 702 and the light receiving means 703 by jetting air from the air supply nozzles 78a and 78b after cleaning water is supplied to the light emitting means 702 and the light receiving means 703 at the time of cutting, it can detect the time of exchanging the cutting blade 54 and a chipped cutting blade always with stability and high accuracy without being influenced by cleaning water.

Further, since the cutting blade detection mechanism 7 of the illustrated embodiment is constituted such that the openings of the air supply nozzles 78a and 78b are arranged adjacent to the light emitting means 702 and the light receiving means 703 and the openings of the cleaning water supply nozzles 77a and 77b are arranged behind the air supply nozzles 78a and 78b, respectively, the cleaning water remaining in the cleaning water supply nozzles 77a and 77b are not sucked and atomized when air is supplied after the supply of the cleaning water is stopped, like the cutting blade detection mechanism 6 for detecting the standard position of the cutting direction of the cutting blade 54. Therefore, cleaning water adhered to the light emitting means 702 and the light receiving means 703 can be blown off by air supplied from the air supply nozzles 78a and 78b effectively.

Since the cutting blade detection mechanisms for a cutting machine of the present invention are constituted as described above, the following function effects are obtained.

That is, according to the present invention, the cutting blade detection mechanism for a cutting machine, having a cutting blade passing gap into which a cutting blade passes and a light emitting means and a light receiving means both of which face the blade passing gap has cleaning water supply nozzles for supplying cleaning water to the end surfaces of the light emitting means and the light receiving means and air supply nozzles for supplying air to the end surfaces of the light emitting means and the light receiving means. Therefore, contamination scattered at the time when the workpiece is cut with the cutting blade is not adhered to the light emitting means and the light receiving means. Consequently, the cutting blade detection mechanism can prevent a reduction in the amount of emitted light caused by the adhesion of contamination to the light emitting means and a reduction in the amount of received light caused by the adhesion of contamination to the light receiving means and hence, can detect the state of the cutting blade always with stability and high accuracy.

Further, according to the present invention, the openings of the air supply nozzles are arranged adjacent to the light emitting means and the light receiving means and the openings of the cleaning water supply nozzles are arranged behind the air supply nozzles. Accordingly, cleaning water remaining in the cleaning water supply nozzles are not sucked and atomized when air is supplied after the supply of cleaning water is stopped. Therefore, cleaning water adhered to the light emitting means and the light receiving means can be blown off by air supplied from the air supply nozzles effectively.

What is claimed is:

1. A cutting blade detection mechanism for a cutting machine, which has a blade passing gap into which a cutting blade for cutting a workpiece held by a workpiece holding means for holding the workpiece passes, a light emitting means, and a light receiving means both of which face the blade passing gap, wherein the mechanism comprises cleaning water supply nozzles for supplying cleaning water to the end surfaces of the light emitting means and the light receiving means and air supply nozzles for supplying air to the end surfaces of the light emitting means and the light receiving means, respectively, and wherein the openings of the air supply nozzles are arranged adjacent to the light emitting means and the light receiving means, and the openings of the cleaning water supply nozzles are arranged behind the openings of the air supply nozzles, respectively.

2. The cutting blade detection mechanism for a cutting machine according to claim 1, which is disposed on the workpiece holding means and detects the standard position of the cutting blade.

3. The cutting blade detection mechanism for a cutting machine according to claim 1, wherein the cutting blade detection mechanism is disposed on a spindle unit having the cutting blade and detects the abrasion and a chipped cutting blade.

* * * * *